United States Patent
Im et al.

(10) Patent No.: US 9,954,039 B2
(45) Date of Patent: Apr. 24, 2018

(54) ORGANIC LIGHT EMITTING DISPLAY DEVICE

(71) Applicant: LG Display Co., Ltd., Seoul (KR)

(72) Inventors: Jonghyeok Im, Busan (KR); Eunah Kim, Asan-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/360,233

(22) Filed: Nov. 23, 2016

(65) Prior Publication Data

US 2017/0170246 A1    Jun. 15, 2017

(30) Foreign Application Priority Data

Dec. 15, 2015    (KR) ........................ 10-2015-0179141

(51) Int. Cl.
| | |
|---|---|
| *H01L 29/08* | (2006.01) |
| *H01L 35/24* | (2006.01) |
| *H01L 51/00* | (2006.01) |
| *H01L 27/32* | (2006.01) |
| *H01L 51/52* | (2006.01) |

(52) U.S. Cl.
CPC ...... *H01L 27/3246* (2013.01); *H01L 27/3258* (2013.01); *H01L 27/3262* (2013.01); *H01L 27/3276* (2013.01); *H01L 27/3279* (2013.01); *H01L 51/5212* (2013.01); *H01L 51/5228* (2013.01); *H01L 27/326* (2013.01)

(58) Field of Classification Search
None
See application file for complete search history.

(56) References Cited

U.S. PATENT DOCUMENTS

| | | | | |
|---|---|---|---|---|
| 8,373,170 | B2* | 2/2013 | Murakami | .......... H01L 27/3246 257/72 |
| 8,963,129 | B2* | 2/2015 | Chung | ............... H01L 27/3246 257/40 |
| 9,018,621 | B2* | 4/2015 | Park | ..................... H01L 51/525 257/40 |
| 2007/0064486 | A1 | 3/2007 | Sung et al. | |
| 2011/0057191 | A1* | 3/2011 | Murakami | .......... H01L 27/3246 257/59 |

(Continued)

OTHER PUBLICATIONS

Non-Final rejection of U.S. Appl. No. 15/157,327 dated Jul. 24, 2017.*

(Continued)

*Primary Examiner* — Telly Green
(74) *Attorney, Agent, or Firm* — Birch, Stewart, Kolasch & Birch, LLP

(57) ABSTRACT

An organic light emitting display device can include a substrate; an anode electrode on the substrate; an organic emitting layer on the anode electrode; a cathode electrode on the organic emitting layer; an auxiliary electrode connected to the cathode electrode; a bank provided on either side of the auxiliary electrode; and a partition spaced apart from the bank and provided on the auxiliary electrode, in which the partition includes a plurality of first partitions provided on the auxiliary electrode and spaced apart from each other, and the partition further includes a second partition provided on the plurality of first partitions, and a width of an upper surface of the second partition is larger than a width of a lower surface of the second partition.

19 Claims, 5 Drawing Sheets

(56) References Cited

U.S. PATENT DOCUMENTS

| | | | | |
|---|---|---|---|---|
| 2011/0272675 A1* | 11/2011 | Chung | ............... | H01L 51/5221 |
| | | | | 257/40 |
| 2013/0099218 A1 | 4/2013 | Lee et al. | | |
| 2013/0113368 A1 | 5/2013 | Min | | |
| 2014/0312323 A1* | 10/2014 | Park | .................. | H01L 51/525 |
| | | | | 257/40 |
| 2014/0353631 A1* | 12/2014 | Park | ................ | H01L 51/5228 |
| | | | | 257/40 |
| 2015/0034921 A1 | 2/2015 | Kim | | |
| 2016/0240598 A1* | 8/2016 | You | ................. | H01L 27/3276 |
| 2017/0133620 A1* | 5/2017 | Lee | ................ | H01L 51/5212 |
| 2017/0141176 A1* | 5/2017 | Im | .................. | H01L 51/5228 |

OTHER PUBLICATIONS

Non-Final rejection of U.S. Appl. No. 15/347,507 dated Aug. 28, 2017.*

* cited by examiner

ORGANIC LIGHT EMITTING DISPLAY DEVICE

CROSS REFERENCE TO RELATED APPLICATIONS

This application claims the benefit of the Korean Patent Application No. 10-2015-0179141 filed in the Republic of Korea on Dec. 15, 2015, which is hereby incorporated by reference as if fully set forth herein.

BACKGROUND OF THE INVENTION

Field of the Disclosure

Embodiments of the present invention relate to an organic light emitting display device, and more particularly, to a top emission type organic light emitting display device.

Discussion of the Related Art

An organic light emitting display (OLED) device, which is a self-light emitting display device, has advantages of low power consumption, rapid response speed, high emission efficiency, high luminance and wide viewing angle.

According to the direction of light emitted from an organic light emitting device, the OLED device may be generally classified into a top emission type and a bottom emission type. In the bottom emission type, a circuit device is disposed between an emitting layer and an image displaying surface, which may lower an aperture ratio of the OLED device. In the top emission type, a circuit device is not disposed between an emitting layer and an image displaying surface, thus an aperture ratio can be improved when compared to the bottom emission type.

FIG. 1 is a cross sectional view of a related art top emission type OLED device.

As shown in FIG. 1, a thin film transistor layer (T) including an active layer 11, a gate insulating film 12, a gate electrode 13, an insulating interlayer 14, a source electrode 15, and a drain electrode 16 is provided on a substrate 10, and then a passivation layer 20 and a planarization layer 30 are sequentially provided on the thin film transistor layer (T).

Also, an anode electrode 40 and an auxiliary electrode 50 are provided on the planarization layer 30. The auxiliary electrode 50 is provided to lower a resistance of a cathode electrode 90. In the top emission type, light emitted from an organic emitting layer 80 passes through the cathode electrode 90. In this reason, the cathode electrode 90 is formed of a transparent conductive material, which causes the increase of resistance therein. In order to lower the resistance of the cathode electrode 90, the cathode electrode 90 is connected with the auxiliary electrode 50.

On the anode electrode 40 and the auxiliary electrode 50, a bank 60 is provided to define a pixel region. Also, the organic emitting layer 80 is provided in the pixel region defined by the bank 60.

If the auxiliary electrode 50 is covered by the organic emitting layer 80, an electrical connection between the cathode electrode 90 and the auxiliary electrode 50 becomes difficult. Thus, in order to prevent the auxiliary electrode 50 from being covered by the organic emitting layer 80, a partition 70 is provided on the auxiliary electrode 50. The partition 70 is spaced apart from the bank 60, whereby the auxiliary electrode 50 and the cathode electrode 90 are connected to each other via a gap space between the partition 70 and the bank 60.

The partition 70 can include a first partition 71 and a second partition 72, in which the partition 70 is formed in a structure of eaves. Thus, according as the organic emitting layer 80 with superior straightness for the properties of process is blocked by the partition 70, it is possible to prevent the organic emitting layer 80 from being permeated into the gap space between the partition 70 and the bank 60. Meanwhile, the cathode electrode 90 with inferior straightness for the properties of process permeates into the gap space between the partition 70 and the bank 60, and is then connected to the auxiliary electrode 50.

In the related art top emission type OLED device, an electrical connection between the cathode electrode 90 and the auxiliary electrode 50 is made in the gap space between the partition 70 and the bank 60. However, if there is a mis-alignment during a process of forming the partition 70, it can cause a decrease in the contact area between the cathode electrode 90 and the auxiliary electrode 50. This will be described with reference to FIGS. 2A to 2C.

FIGS. 2A to 2C are plane views illustrating the electrical connection between the cathode electrode 90 and the auxiliary electrode 50 in the related art top emission type OLED device.

FIG. 2A illustrates a situation in which a mis-alignment does not occur between the first partition 71 and the second partition 72, and FIG. 2B and FIG. 2C illustrates a situation in which a mis-alignment occurs between the first partition 71 and the second partition 72 due to the second partition 72 being shifted to the left or right.

As shown in FIG. 2A, when there is no mis-alignment between the first partition 71 and the second partition 72, it is possible to secure a predetermined design in a dotted-line area corresponding to a contact area between the cathode electrode 90 and the auxiliary electrode 50. For reference, the dotted-line area corresponds to the contact area between the cathode electrode 90 and the auxiliary electrode 50 by the cathode electrode 90 being permeated into the area below the second partition 72.

However, as shown in FIGS. 2B and 2C, if there is the mis-alignment between the first partition 71 and the second partition 72, the dotted-line area corresponding to the contact area between the cathode electrode 90 and the auxiliary electrode 50 is to be smaller than the predetermined design. That is, the cathode electrode 90 has a limitation on permeation into the area below the second partition 72, whereby there is a vacancy where the cathode electrode 90 is not deposited in the area caused by the shifted second partition 72, to thereby decrease the contact area between the cathode electrode 90 and the auxiliary electrode 50.

If there is a mis-alignment between the first partition 71 and the second partition 72, the contact area between the cathode electrode 90 and the auxiliary electrode 50 is decreased in size, which might increase the resistance in the cathode electrode 90.

SUMMARY OF THE INVENTION

Accordingly, embodiments of the present invention are directed to a top emission type organic light emitting display device that substantially obviates one or more problems due to limitations and disadvantages of the related art.

An aspect of embodiments of the present invention is directed to providing a top emission type organic light emitting display device which is capable of preventing a decrease in contact area between a cathode electrode and an auxiliary electrode even if there is a mis-alignment between a first partition and a second partition.

Additional advantages and features of embodiments of the invention will be set forth in part in the description which follows and in part will become apparent to those having ordinary skill in the art upon examination of the following or may be learned from practice of embodiments of the invention. The objectives and other advantages of embodiments of the invention may be realized and attained by the structure particularly pointed out in the written description and claims hereof as well as the appended drawings.

To achieve these and other advantages and in accordance with the purpose of embodiments of the invention, as embodied and broadly described herein, there is provided an anode electrode, an organic emitting layer, a cathode electrode, an auxiliary electrode connected to the cathode electrode, a bank provided on one side and the other side of the auxiliary electrode, and a partition spaced apart from the bank and provided on the auxiliary electrode, in which the partition includes a plurality of first partitions provided on the auxiliary electrode and spaced apart from each other, and a second partition provided on the plurality of first partitions, in which a width in an upper surface of the second partition is larger than a width in a lower surface of the second partition.

It is to be understood that both the foregoing general description and the following detailed description of embodiments of the present invention are exemplary and explanatory and are intended to provide further explanation of the invention as claimed.

BRIEF DESCRIPTION OF THE DRAWINGS

The accompanying drawings, which are included to provide a further understanding of embodiments of the invention and are incorporated in and constitute a part of this application, illustrate embodiment(s) of the invention and together with the description serve to explain the principle of embodiments of the invention. In the drawings.

DETAILED DESCRIPTION OF THE EMBODIMENTS

Figure 1:
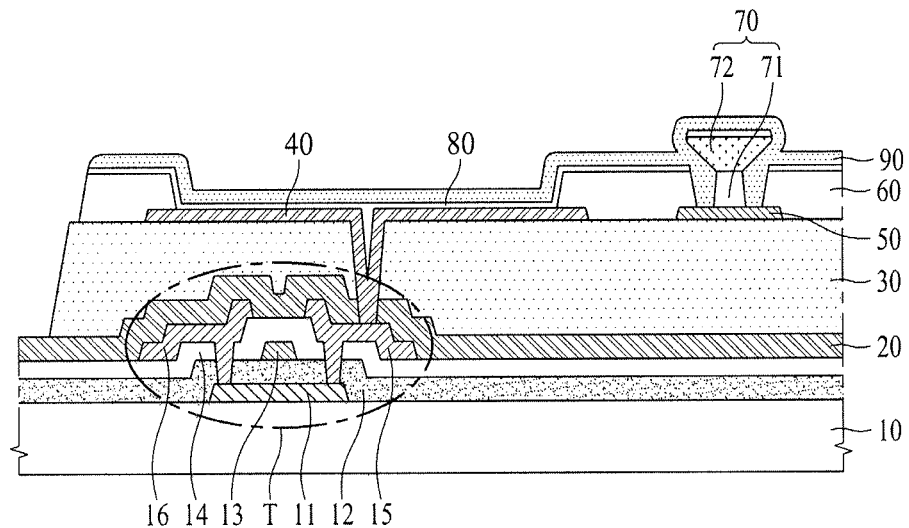
FIG. 1 is a cross sectional view illustrating a related art top emission type organic light emitting display device.
Figure 2A:
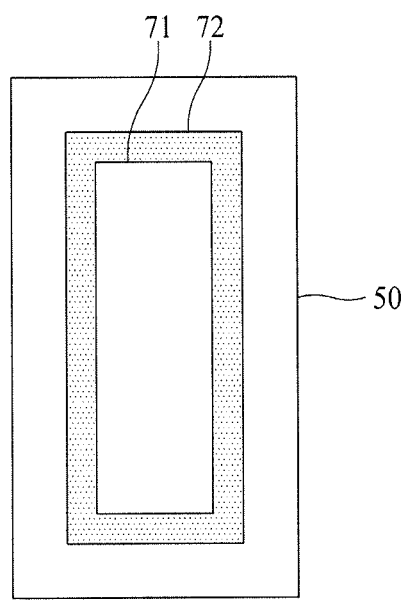
FIGS. 2A to 2C are plane views illustrating an electrical connection between a cathode electrode and an auxiliary electrode in the related art top emission type OLED device.
Figure 2B:
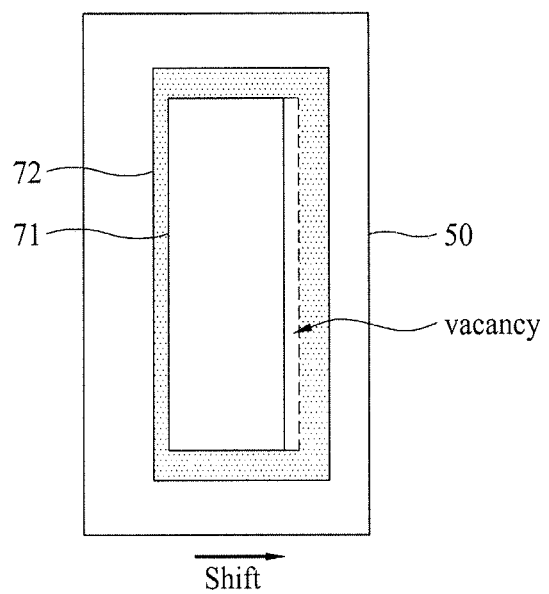
Figure 2C:
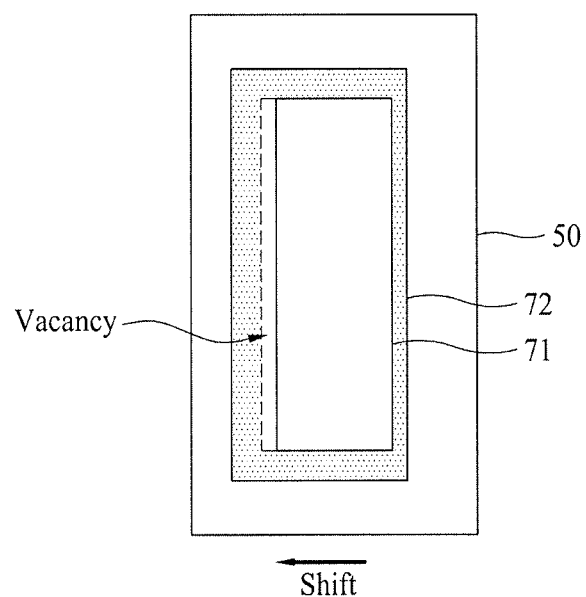

Reference will now be made in detail to the exemplary embodiments of the present invention, examples of which are illustrated in the accompanying drawings. Wherever possible, the same reference numbers will be used throughout the drawings to refer to the same or like parts. Advantages and features of the present invention, and implementation methods thereof will be clarified through following embodiments described with reference to the accompanying drawings. The present invention can, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of the claims.

A shape, a size, a ratio, an angle, and a number disclosed in the drawings for describing embodiments of the present invention are merely an example, and thus, the present invention is not limited to the illustrated details. Like reference numerals refer to like elements throughout. In the following description, when the detailed description of the relevant known function or configuration is determined to unnecessarily obscure the important point of the present invention, the detailed description will be omitted. In a situation where "comprise," "have" and "include" are used in the present specification, another part may be added unless "only" is used. The terms of a singular form can include plural forms unless referred to the contrary.

In construing an element, the element is construed as including an error region although there is no explicit description.

In description of embodiments of the present invention, when a structure (for example, an electrode, a line, a wiring, a layer, or a contact) is described as being formed at an upper portion/lower portion of another structure or on/under the other structure, this description should be construed as including a case where the structures contact each other and moreover, a case where a third structure is disposed therebetween.

In describing a temporal relationship, for example, when the temporal order is described as "after," "subsequent," "next" and "before," the order may not be continuous unless "just" or "directly" is used.

It will be understood that, although the terms "first," "second," etc. may be used herein to describe various elements, these elements should not be limited by these terms. These terms are only used to distinguish one element from another. For example, a first element could be termed a second element, and similarly, a second element could be termed a first element, without departing from the scope of the present invention.

Features of various embodiments of the present invention can be partially or overall coupled to or combined with each other, and can be variously inter-operated with each other and driven technically as those skilled in the art can sufficiently understand. The embodiments of the present invention can be carried out independently from each other, or can be carried out together in co-dependent relationship.

Hereinafter, an organic light emitting display device according to embodiments of the present invention will be described in detail with reference to the accompanying drawings.

Figure 3:
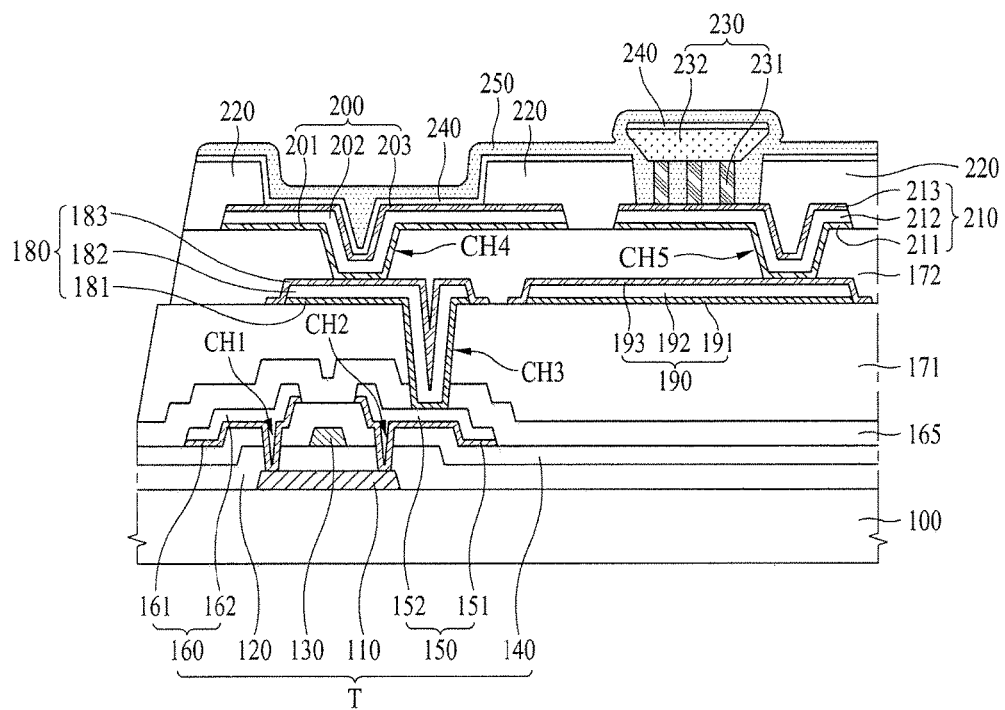
FIG. 3 is a cross sectional view illustrating an organic light emitting display device according to one embodiment of the present invention.

FIG. 3 is a cross sectional view illustrating an organic light emitting display device according to one embodiment of the present invention.

As shown in FIG. 3, the organic light emitting display device according to one embodiment of the present invention can include a substrate 100, a thin film transistor layer (T), a passivation layer 165, a first planarization layer 171, a second planarization layer 172, a first anode electrode 180, a second anode electrode 200, a first auxiliary electrode 190, a second auxiliary electrode 210, a bank 220, a partition 230, an organic emitting layer 240, and a cathode electrode 250.

The substrate 100 can be formed of glass or transparent plastic, but the substrate 100 is not limited to these materials.

The thin film transistor layer (T) can include an active layer 110, a gate insulating film 120, a gate electrode 130, an insulating interlayer 140, a source electrode 150, and a drain electrode 160.

The active layer 110 is provided on the substrate 100, in which the active layer 110 overlaps with the gate electrode 130. The active layer 110 can be formed a silicon-based semiconductor material or oxide-based semiconductor material. Also, a light shielding layer can be additionally provided between the substrate 100 and the active layer 110. In this instance, external light, which is incident on a lower surface of the substrate 100, is blocked by the light shielding layer so that it is possible to prevent the active layer 110 from being damaged by the external light.

The gate insulating film 120 is provided on the active layer 110. The gate insulating film 120 insulates the active layer 110 and the gate electrode 130 from each other. For example, the gate insulating film 120 can be formed of an inorganic insulating material, and more particularly, the gate insulating film 120 can be formed in a single-layered structure of the inorganic insulating material such as silicon oxide SiOx or silicon nitride SiNx, or a multi-layered structure of the above silicon oxide SiOx and silicon nitride SiNx, but not limited to these structures.

The gate electrode 130 is provided on the gate insulating film 120. The gate electrode 130 overlaps with the active layer 110, and the gate insulating film 120 is interposed between the gate electrode 130 and the active layer 110 being overlapped with each other. The gate electrode 130 can be formed in a single-layered structure or multi-layered structure among molybdenum (Mo), aluminum (Al), chrome (Cr), aurum (Au), titanium (Ti), nickel (Ni), neodymium (Nd), copper (Cu) and their alloys, but not limited to these materials.

The insulating interlayer 140 is provided on the gate electrode 130. The insulating interlayer 140 is formed of the same material as that of the gate insulating film 120. For example, the insulating interlayer 140 can be formed in a single-layered structure of the inorganic insulating material such as silicon oxide SiOx or silicon nitride SiNx, or a multi-layered structure of the above silicon oxide SiOx and silicon nitride SiNx, but not limited to these materials and structures.

The source electrode 150 and the drain electrode 160 confronting each other are provided on the insulating interlayer 140. A first contact hole (CH1) for exposing one end of the active layer 110 is provided in the aforementioned gate insulating film 120 and the insulating interlayer 140, and a second contact hole (CH2) for exposing the other end of the active layer 110 is provided in the aforementioned gate insulating film 120 and the insulating interlayer 140. The source electrode 150 is connected to the other end of the active layer 110 via the second contact hole (CH2), and the drain electrode 160 is connected to one end of the active layer 110 via the first contact hole (CH1).

The source electrode 150 can include a lower source electrode 151 and an upper source electrode 152.

The lower source electrode 151 is provided between the insulating interlayer 140 and the upper source electrode 152, in which the lower source electrode 151 enhances an adhesive strength between the insulating interlayer 140 and the upper source electrode 152. Also, the lower source electrode 151 protects a lower surface of the upper source electrode 152 so that it is possible to prevent the lower surface of the upper source electrode 152 from being corroded. Thus, an oxidation degree of the lower source electrode 151 can be lower than an oxidation degree of the upper source electrode 152. That is, a corrosion resistance in a material of the lower source electrode 151 can be superior to a corrosion resistance in a material of the upper source electrode 152. The lower source electrode 151 functions as an adhesion enhancement layer or a corrosion preventing layer. The lower source electrode 151 can be formed of an alloy MoTi of molybdenum and titanium, but not limited to this material.

The upper source electrode 152 is provided on an upper surface of the lower source electrode 151. The upper source electrode 152 can be formed of a low-resistance metal material such as copper Cu, but not limited to this metal material. The upper source electrode 152 can be formed of a metal material whose resistance is relatively lower than that of the lower source electrode 151. In order to lower a total resistance of the source electrode 150, a thickness of the upper source electrode 152 is larger than a thickness of the lower source electrode 151, preferably.

In the same way as the aforementioned source electrode 150, the drain electrode 160 can include a lower drain electrode 161 and an upper drain electrode 162.

The lower drain electrode 161 is provided between the insulating interlayer 140 and the upper drain electrode 162, in which the lower drain electrode 161 enhances an adhesive strength between the insulating interlayer 140 and the upper drain electrode 162. Also, the lower drain electrode 161 prevents a lower surface of the upper drain electrode 162 from being corroded. Thus, an oxidation degree of the lower drain electrode 161 can be lower than an oxidation degree of the upper drain electrode 162. That is, a corrosion resistance in a material of the lower drain electrode 161 can be superior to a corrosion resistance in a material of the upper drain electrode 162. The lower drain electrode 161 can be formed of an alloy MoTi of molybdenum and titanium, but not limited to this material.

The upper drain electrode 162 is provided on an upper surface of the lower drain electrode 161. The upper drain electrode 162 can be formed of the same material as that of the aforementioned upper source electrode 152, that is, copper Cu, but not limited to this material. In order to lower a total resistance of the drain electrode 160, a thickness of the upper drain electrode 162 is larger than a thickness of the lower drain electrode 161, preferably.

The upper drain electrode 162 can be formed of the same material as that of the upper source electrode 152, and the upper drain electrode 162 can be formed in the same thickness as that of the upper source electrode 152. The lower drain electrode 161 can be formed of the same material as that of the lower source electrode 151, and the lower drain electrode 161 can be formed in the same thickness as that of the lower source electrode 151. In this instance, the drain electrode 160 and the source electrode 150 can be manufactured at the same time by the same process.

A structure of the thin film transistor layer (T) is not limited to the above structure, that is, a structure of the thin film transistor layer (T) can be changed to various shapes generally known to those in the art. For example, the drawing shows a top gate structure where the gate electrode 130 is provided on the active layer 110, but not necessarily. That is, it is possible to provide a bottom gate structure where the gate electrode 130 is provided below the active layer 110.

The passivation layer 165 is provided on the thin film transistor layer (T), and more particularly, on upper surfaces of the source electrode 150 and the drain electrode 160. The passivation layer 165 protects the thin film transistor layer (T). The passivation layer 165 can be formed of an inorganic insulating material, for example, silicon oxide film SiOx or silicon nitride film SiNx, but not limited to these materials.

The first planarization layer 171 is provided on the passivation layer 165. The first planarization layer 171 is provided to planarize an upper surface of the substrate 100 with the thin film transistor layer (T). The first planarization layer 171 can be formed of an organic insulating material, for example, acryl resin, epoxy resin, phenolic resin, polyamide resin, polyimide resin, and etc., but not limited to these materials.

The first anode electrode 180 and the first auxiliary electrode 190 are provided on the first planarization layer 171. That is, the first anode electrode 180 and the first auxiliary electrode 190 are formed in the same layer. A third contact hole (CH3) for exposing the source electrode 150 is provided in the aforementioned passivation layer 165 and the first planarization layer 171. The source electrode 150 and the first anode electrode 180 are connected to each other via the third contact hole (CH3). If needed, the third contact hole (CH3) can expose the drain electrode 160, whereby the drain electrode 160 and the first anode electrode 180 can be connected to each other via the third contact hole (CH3).

The first anode electrode 180 can include a first lower anode electrode 181, a first upper anode electrode 182, and a first cover anode electrode 183.

The first lower anode electrode 181 is provided between the planarization layer 170 and the first upper anode electrode 182, in which the first lower anode electrode 181 enhances an adhesive strength between the planarization layer 170 and the first upper anode electrode 182. Also, the first lower anode electrode 181 protects a lower surface of the first upper anode electrode 182, to thereby prevent the lower surface of the first upper anode electrode 182 from being corroded. Thus, an oxidation degree of the first lower anode electrode 181 can be lower than an oxidation degree of the first upper anode electrode 182. That is, a corrosion resistance in a material of the first lower anode electrode 181 can be superior to a corrosion resistance in a material of the first upper anode electrode 182. Also, the first lower anode electrode 181 protects an upper surface of the upper source electrode 152, to thereby prevent the upper surface of the upper source electrode 152 from being corroded. Thus, an oxidation degree of the first lower anode electrode 181 can be lower than an oxidation degree of the upper source electrode 152. That is, a corrosion resistance in a material of the first lower anode electrode 181 can be superior to a corrosion resistance in a material of the upper source electrode 152. Accordingly, it is possible to provide the aforementioned dual-layered structure in the source electrode 150 so the first lower anode electrode 180 prevents the upper surface of the upper source electrode 152 from becoming corroded. The first lower anode electrode 181 functions as an adhesion enhancement layer and/or a corrosion preventing layer. The first lower anode electrode 181 can be formed of an alloy MoTi of molybdenum and titanium, but not limited to this material.

The first upper anode electrode 182 is provided between the first lower anode electrode 181 and the first cover anode electrode 183. The first upper anode electrode 182 can be formed of a low-resistance metal material such as copper Cu, but not limited to this metal material. The first upper anode electrode 182 can be formed of a metal material whose resistance is relatively lower than that of the first lower anode electrode 181 and the first cover anode electrode 183. In order to lower a total resistance of the first anode electrode 180, a thickness of the first upper anode electrode 182 is larger than a thickness of each of the first lower anode electrode 181 and the first cover anode electrode 183, preferably.

The first cover anode electrode 183 is provided on the first upper anode electrode 182. The first cover anode electrode 183 covers the upper and lateral surfaces of the first upper anode electrode 182 so that it is possible to prevent the upper and lateral surfaces of the first upper anode electrode 182 from being corroded. Thus, an oxidation degree of the first cover anode electrode 183 can be lower than an oxidation degree of the first upper anode electrode 182. That is, a corrosion resistance in a material of the first cover anode electrode 183 can be superior to a corrosion resistance in a material of the first upper anode electrode 182.

The first cover anode electrode 183 can cover the lateral surface of the first lower anode electrode 181. In this instance, an oxidation degree of the first cover anode electrode 183 can be lower than an oxidation degree of the first lower anode electrode 181. That is, a corrosion resistance in a material of the first cover anode electrode 183 can be superior to a corrosion resistance in a material of the first lower anode electrode 181. The first cover anode electrode 183 can be formed of a transparent conductive material, for example, indium-tin-oxide ITO, but not limited to this material.

In the same manner as the first anode electrode 180, the first auxiliary electrode 190 can include a first lower auxiliary electrode 191, a first upper auxiliary electrode 192, and a first cover auxiliary electrode 193.

The first lower auxiliary electrode 191 is provided between the planarization layer 170 and the first upper auxiliary electrode 192, in which the first lower auxiliary electrode 191 enhances an adhesive strength between the planarization layer 170 and the first upper auxiliary electrode 192. Also, the first lower auxiliary electrode 191 prevents a lower surface of the first upper auxiliary electrode 192 from being corroded. Thus, an oxidation degree of the first lower auxiliary electrode 191 can be lower than an oxidation degree of the first upper auxiliary electrode 192. That is, a corrosion resistance in a material of the first lower auxiliary electrode 191 can be superior to a corrosion resistance in a material of the first upper auxiliary electrode 192. The first lower auxiliary electrode 191 can be formed of the same material as that of the first lower anode electrode 181, that is, alloy MoTi of molybdenum and titanium, but not limited to this material.

The first upper auxiliary electrode 192 is provided between the first lower auxiliary electrode 191 and the first cover auxiliary electrode 193. The first upper auxiliary electrode 192 can be formed of the same material as that of the first upper anode electrode 182, that is, copper Cu, but not limited to this material. In order to reduce a total resistance of the first auxiliary electrode 190, a thickness of the first upper auxiliary electrode 192 with the relatively-low resistance is larger than a thickness of each of the first lower auxiliary electrode 191 and the first cover auxiliary electrode 193 with the relatively-high resistance, preferably.

The first cover auxiliary electrode 193 is provided on the first upper auxiliary electrode 192. The first cover auxiliary electrode 193 covers the upper and lateral surfaces of the first upper auxiliary electrode 192 so that it is possible to prevent the upper and lateral surfaces of the first upper auxiliary electrode 192 from being corroded. Thus, an oxidation degree of the first cover auxiliary electrode 193 can be lower than an oxidation degree of the first upper auxiliary electrode 192. That is, a corrosion resistance in a material of the first cover auxiliary electrode 193 can be superior to a corrosion resistance in a material of the first upper auxiliary electrode 192.

The first cover auxiliary electrode 193 can cover the lateral surface of the first lower auxiliary electrode 191. In this instance, an oxidation degree of the first cover auxiliary electrode 193 can be lower than an oxidation degree of the first lower auxiliary electrode 191. That is, a corrosion resistance in a material of the first cover auxiliary electrode 193 can be superior to a corrosion resistance in a material of the first lower auxiliary electrode 191. The first cover auxiliary electrode 193 can be formed of a transparent conductive material, for example, indium-tin-oxide ITO, but not limited to this material.

The first cover auxiliary electrode 193 can be formed of the same material as that of the first cover anode electrode 183, and the first cover auxiliary electrode 193 can be manufactured in the same thickness as that of the first cover anode electrode 183. The first upper auxiliary electrode 192 can be formed of the same material as that of the first upper anode electrode 182, and the first upper auxiliary electrode 192 can be manufactured in the same thickness as that of the first upper anode electrode 182. The first lower auxiliary electrode 191 can be formed of the same material as that of the first lower anode electrode 181, and the first lower auxiliary electrode 191 can be manufactured in the same thickness as that of the first lower anode electrode 181. In this instance, the first auxiliary electrode 190 and the first anode electrode 180 can be manufactured at the same time by the same process.

The second planarization layer 172 is provided on the first auxiliary electrode 190 and the first anode electrode 180. The second planarization layer 172 together with the aforementioned first planarization layer 171 is provided to planarize the upper surface of the substrate 100. The second planarization layer 172 can be formed of an organic insulating material, for example, acryl resin, epoxy resin, phenolic resin, polyamide resin, polyimide resin, and etc., but not limited to these materials.

A fourth contact hole (CH4) and a fifth contact hole (CH5) are provided in the second planarization layer 172. The first anode electrode 180 is exposed via the fourth contact hole (CH4), and the first auxiliary electrode 190 is exposed via the fifth contact hole (CH5).

The second anode electrode 200 is provided on the second planarization layer 172. The second anode electrode 200 is connected to the first anode electrode 180 via the fourth contact hole (CH4). The second anode electrode 200 reflects light emitted from the organic emitting layer 240 to an upper direction, whereby the second anode electrode 200 includes a material with good reflectance. The second anode electrode 200 can include a second lower anode electrode 201, a second central anode electrode 202, and a second upper anode electrode 203.

The second lower anode electrode 201 is provided between the first anode electrode 180 and the second central anode electrode 202. The second lower anode electrode 201 protects a lower surface of the second central anode electrode 202, to thereby prevent the lower surface of the second central anode electrode 202 from being corroded. Thus, an oxidation degree of the second lower anode electrode 201 can be lower than an oxidation degree of the second central anode electrode 202. That is, a corrosion resistance in a material of the second lower anode electrode 201 can be superior to a corrosion resistance in a material of the second central anode electrode 202. The second lower anode electrode 201 can be formed of a transparent conductive material such as indium-tin-oxide ITO, but not limited to this material.

The second central anode electrode 202 is provided between the second lower anode electrode 201 and the second upper anode electrode 203. The second central anode electrode 202 is formed of a material with relatively-low resistance and relatively-high reflectance in comparison to the second lower anode electrode 201 and the second upper anode electrode 203, for example, argentums Ag, but not limited to this material. In order to lower a total resistance of the second anode electrode 200, a thickness of the second central anode electrode 202 with relatively-low resistance is larger than a thickness in each of the second lower anode electrode 201 and the second upper anode electrode 203 with relatively-high resistance, preferably.

The second upper anode electrode 203 is provided on an upper surface of the second central anode electrode 202 so that it is possible to prevent the upper surface of the second central anode electrode 202 from being corroded. Thus, an oxidation degree of the second upper anode electrode 203 can be lower than an oxidation degree of the second central anode electrode 202. That is, a corrosion resistance in a material of the second upper anode electrode 203 can be superior to a corrosion resistance in a material of the second central anode electrode 202. The second upper anode electrode 203 can be formed of a transparent conductive material such as indium-tin-oxide ITO, but not limited to this material.

In the same way as the aforementioned second anode electrode 200, the second auxiliary electrode 210 is provided on the second planarization layer 172. The second auxiliary electrode 210 is connected to the first auxiliary electrode 190 via the fifth contact hole (CH5). The second auxiliary electrode 210 together with the first auxiliary electrode 190 lowers a resistance of the cathode electrode 250.

The second auxiliary electrode 210 can include a second lower auxiliary electrode 211, a second central auxiliary electrode 212, and a second upper auxiliary electrode 213.

The second lower auxiliary electrode 211 is provided between the first auxiliary electrode 190 and the second central auxiliary electrode 212. The second lower auxiliary electrode 211 protects a lower surface of the second central auxiliary electrode 212, to thereby prevent the lower surface of the second central auxiliary electrode 212 from being corroded. Thus, an oxidation degree of the second lower auxiliary electrode 211 can be lower than an oxidation degree of the second central auxiliary electrode 212. That is, a corrosion resistance in a material of the second lower auxiliary electrode 211 can be superior to a corrosion resistance in a material of the second central auxiliary electrode 212. The second lower auxiliary electrode 211 can be formed of a transparent conductive material, for example indium-tin-oxide ITO, but not limited to this material.

The second central auxiliary electrode 212 is provided between the second lower auxiliary electrode 211 and the second upper auxiliary electrode 213. The second central auxiliary electrode 212 is formed of a material with relatively-low resistance and relatively-high reflectance in comparison to the second lower auxiliary electrode 211 and the second upper auxiliary electrode 213, for example, argentums Ag, but not limited to this material. In order to lower a total resistance of the second auxiliary electrode 210, a thickness of the second central auxiliary electrode 212 with relatively-low resistance is larger than a thickness in each of the second lower auxiliary electrode 211 and the second upper auxiliary electrode 213 with relatively-high resistance, preferably.

The second upper auxiliary electrode 213 is provided on an upper surface of the second central auxiliary electrode 212 so that it is possible to prevent the upper surface of the second central auxiliary electrode 212 from being corroded. Thus, an oxidation degree of the second upper auxiliary electrode 213 can be lower than an oxidation degree of the second central auxiliary electrode 212. That is, a corrosion resistance in a material of the second upper auxiliary electrode 213 can be superior to a corrosion resistance in a material of the second central auxiliary electrode 212. The second upper auxiliary electrode 213 can be formed of a transparent conductive material such as indium-tin-oxide ITO, but not limited to this material.

The second upper auxiliary electrode 213 can be formed of the same material as that of the second upper anode electrode 203, and the second upper auxiliary electrode 213 can be manufactured in the same thickness as that of the second upper anode electrode 203. The second central auxiliary electrode 212 can be formed of the same material as that of the second central anode electrode 202, and the second central auxiliary electrode 212 can be manufactured in the same thickness as that of the second central anode electrode 202. The second lower auxiliary electrode 211 can be formed of the same material as that of the second lower anode electrode 201, and the second lower auxiliary electrode 211 can be manufactured in the same thickness as that of the second lower anode electrode 201. In this instance, the second auxiliary electrode 210 and the second anode electrode 200 can be manufactured at the same time by the same process.

According to one embodiment of the present invention, there are the two auxiliary electrodes, which include the first auxiliary electrode 190 and the second auxiliary electrode 210, and the first and second auxiliary electrodes are connected to each other, in order to lower the resistance of the cathode electrode 250, thus it is possible to easily control the resistance properties of the auxiliary electrode.

In more detail, the second auxiliary electrode 210 is formed in the same layer as the second anode electrode 200. Thus, if the width of the second auxiliary electrode 210 is increased, the width of the second anode electrode 200 has to be decreased, which may decrease a pixel region of a display device. For this reason, there is a limit to increasing the width of the second auxiliary electrode 210. According to one embodiment of the present invention, the first auxiliary electrode 190 is connected to the second auxiliary electrode 210, and provided below the second auxiliary electrode 210 so that it is possible to lower the resistance of the cathode electrode 250 without decreasing the pixel region.

The first auxiliary electrode 190 is formed in the same layer as the first anode electrode 180, in which the first anode electrode 180 connects the source electrode 150 and the second anode electrode 200 with each other. Thus, it is possible to decrease the width of the first anode electrode 180 and increase the width of the first auxiliary electrode 190. That is, the width of the first auxiliary electrode 190 can be larger than the width of the first anode electrode 180. Furthermore, since the width of the first auxiliary electrode 190 is increased, the first auxiliary electrode 190 can be overlapped with the second anode electrode 200, in order to lower the resistance of the cathode electrode 250.

The bank 220 is provided on the second anode electrode 200 and the second auxiliary electrode 210.

The bank 220, which exposes the upper surface of the second anode electrode 200, is provided on one side and the other side of the second anode electrode 200. According as the bank 220 is provided to expose the upper surface of the second anode electrode 200, it is possible to secure an image-displaying area. Also, the bank 220 is provided on one side and the other side of the second anode electrode 200 so that it is possible to prevent the lateral surface of the second central anode electrode 202 from being exposed to the external, in which the lateral surface of the second central anode electrode 202 is relatively vulnerable to corrosion, thereby preventing the lateral surface of the second central anode electrode 202 from being corroded.

Also, the bank 220, which exposes the upper surface of the second auxiliary electrode 210, is provided on one side and the other side of the second auxiliary electrode 210. Since the bank 220 exposes the upper surface of the second auxiliary electrode 210, it is possible to secure an electrical connection space between the second auxiliary electrode 210 and the cathode electrode 250. Also, the bank 220 is provided on one side and the other side of the second auxiliary electrode 210, in order to prevent the lateral surface of the second central auxiliary electrode 212 from being exposed, in which the lateral surface of the second central auxiliary electrode 212 is relatively vulnerable to corrosion, thereby preventing the lateral surface of the second central auxiliary electrode 212 from being corroded.

Also, the bank 220 is provided between the second anode electrode 200 and the second auxiliary electrode 210, in which the bank 220 electrically insulates the second anode electrode 200 and the second auxiliary electrode 210 from each other. The bank 220 can be formed of an organic insulating material, for example, polyimide resin, acryl resin, benzocyclobutene BCB, and etc., but not limited to these materials.

The partition 230 is provided on the second auxiliary electrode 210. The partition 230 is provided at a predetermined interval spaced away from the bank 220, and the second auxiliary electrode 210 and the cathode electrode 250 are electrically connected to each other via the gap space between the partition 230 and the bank 220. An upper surface of the partition 230 serves as eaves, in order to prevent the organic emitting layer 240 from being deposited in an area below the eaves of the partition 230 for a deposition process of the organic emitting layer 240. For example, the partition 230 can be formed in a reverse tapered shape or a mushroom shape. That is, from a top view, the gap space between the partition 230 and the bank 220 is covered by the upper surface of the partition 230 serving as the eaves. Thus, the organic emitting layer 240 does not permeate into the gap space between the partition 230 and the bank 220, thus the second auxiliary electrode 210 can be exposed via the gap space between the partition 230 and the bank 220. Especially, the organic emitting layer 240 can be manufactured by an evaporation method using a deposition material with superior straightness. Thus, the organic emitting layer 240 is not deposited in the gap space between the partition 230 and the bank 220 for the deposition process of the organic emitting layer 240.

The upper surface of the partition 230 serves as the eaves. That is, a width in the upper surface of the partition 230 is larger than a width in the lower surface of the partition 230. For example, the partition 230 can be formed in a reverse tapered shape or a mushroom shape. The partition 230 can include a first partition 231 disposed at a lower position, and a second partition 232 disposed at an upper position. For serving the function of eaves, a width in an upper surface of the second partition 232 is larger than a width in a lower surface of the second partition 232, and the gap space between the partition 230 and the bank 220 is covered by the upper surface of the second partition 232.

The first partition 231 is provided on the upper surface of the second auxiliary electrode 210. The first partition 231 and the bank 220 can be formed of the same material, and can be manufactured by the same process, so that it is possible to prevent the increase of manufacturing process. Herein, the plurality of first partitions 231 can be provided, in which the plurality of first partitions 231 can be disposed at fixed intervals.

The second partition 232 is provided on the upper surface of the first partition 231. The second partition 232 can be disposed on the upper surface of each of the plurality of first partitions 231.

According to one embodiment of the present invention, the plurality of first partitions 231 are spaced apart from each other, and the second partition 231 is disposed on the upper surface of each of the plurality of first partitions 231. Thus, even if there is a mis-alignment between the first partition 231 and the second partition 232, it is possible to prevent the contact area between the cathode electrode 250 and the second auxiliary electrode 210 from being decreased in size, which will be described with reference to FIGS. 4A to 4C.

Figure 4A:
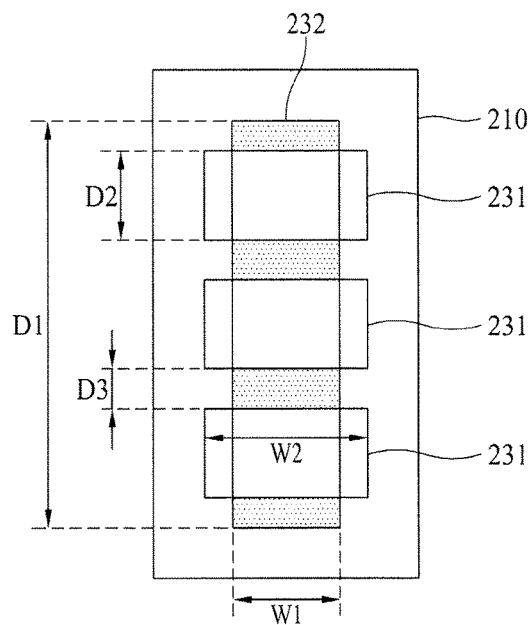
FIGS. 4A to 4C are plane views illustrating first and second partitions in the organic light emitting display device according to an embodiment of the present invention.
Figure 4B:
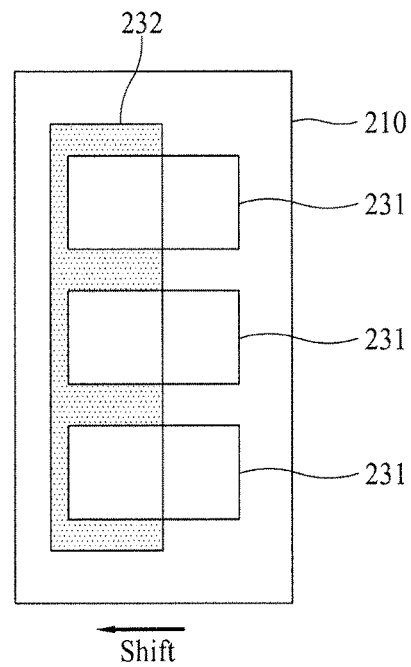
Figure 4C:
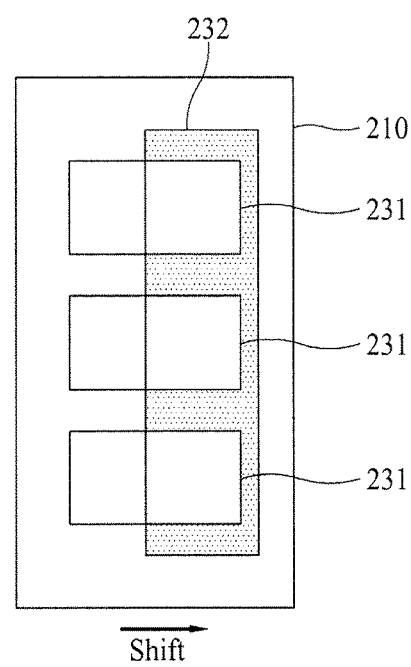

FIGS. 4A to 4C are plane views illustrating the first and second partitions 231 and 232 in the top emission type organic light emitting display device according to one embodiment of the present invention.

FIG. 4A illustrates a situation in which a mis-alignment does not occur between the first partition 231 and the second partition 232, and FIGS. 4B and 4C illustrate a situation in which a mis-alignment does occur between the first partition 231 and the second partition 232 due to the second partition 232 being shifted to the left or right.

As shown in FIG. 4A, the plurality of first partitions 231 are provided on the upper surface of the second auxiliary electrode 210, in which the plurality of first partitions 231 are spaced apart from each other. The plurality of first partitions 231 can be disposed in parallel along a line. The plurality of first partitions 231 can have the same size, but not limited to this structure.

The second partition 232 is provided on the plurality of first partitions 231. The second partition 232 is supported by the plurality of first partitions 231, and the second partition 231 is configured to cross the area between each of the plurality of first partitions 231. For example, the second partition 231 is placed on the plurality of first partitions 231 and forms a bridge type structure over the plurality of first partitions 231.

If there is no mis-alignment between the first partition 231 and the second partition 232, it is possible to secure a predetermined design in a dotted-line area corresponding to the contact area between the cathode electrode 250 and the second auxiliary electrode 210. For reference, the dotted-line area corresponds to the area in which the second partition 232 is not overlapped with the first partition 231, but overlapped with the second auxiliary electrode 210. Accordingly, the dotted-line area corresponds to the contact area between the cathode electrode 250 and the second auxiliary electrode 210 by the deposition of the cathode electrode 250. For reference, the organic emitting layer 240 can be deposited in the remaining area of the second auxiliary electrode 210, that is, the area not overlapped with the second partition 232.

As shown in FIGS. 4B and 4C, even though there is a mis-alignment between the first partition 231 and the second partition 232 by the second partition 232 being shifted to the left or right, the dotted-line area corresponding to the contact area between the cathode electrode 250 and the second auxiliary electrode 210 is not decreased. That is, the dotted-line area corresponding to the contact area between the cathode electrode 250 and the second auxiliary electrode 210 corresponds to the area in which the second partition 232 is not overlapped with the first partition 231, but overlapped with the second auxiliary electrode 210, whereby the dotted-line area of FIG. 4B or 4C is not decreased in size when compared to the dotted-line area of FIG. 4A.

According to one embodiment of the present invention, the cathode electrode 250 and the second auxiliary electrode 210 are in contact with each other in the dotted-line area between each of the plurality of first partitions 231. Thus, even though there is a mis-alignment between the first partition 231 and the second partition 232, the contact area between the cathode electrode 250 and the second auxiliary electrode 210 is not decreased in size. For example, the cathode electrode 250 can fill spaces between the plurality of first partitions 231, in order to provide more contact area with the second auxiliary electrode 210.

Referring to FIG. 4A, a width (W1) of the second partition 232 can be smaller than a width (W2) of the first partition 231. If the width (W1) of the second partition 232 is smaller than the width (W2) of the first partition 231, the second partition 232 is stably positioned on the upper surface of the first partition 231, but not necessarily. The width (W1) of the second partition 232 can be the same as or larger than the width (W2) of the first partition 231.

A length (D1) of the second partition 232 can be larger than a total value of a length (D2) of each of the plurality of first partitions 231 and a length (D3) in each interval or space between the neighboring first partitions 231. For example, if there are the three of first partitions 231, D1 can be larger than {(3×D2)+(2×D3). If the length (D1) of the second partition 232 is larger than the total value of the lengths (D2) in each of the plurality of first partitions 231 adding to the lengths (D3) in the intervals or spaces between the neighboring first partitions 231, a deposition area of the cathode electrode 250 is increased so that it is possible to increase the contact area between the cathode electrode 250 and the second auxiliary electrode 210. For example, the cathode electrode 250 can fill spaces between the plurality of first partitions 231, in order to provide more contact area with the second auxiliary electrode 210.

In this example, the width (W1) of the second partition 232 indicates a length of a relatively-short side, and the length (D1) of the second partition 232 indicates a length of a relatively-long side. Also, the width (W2) of the first partition 231 indicates a length of a side facing the width (W1) of the second partition 232, and the length (D2) of the first partition 231 indicates a length of a side facing the length (D1) of the second partition 232.

Referring once again to FIG. 3, the organic emitting layer 240 is provided on the second anode electrode 200. The organic emitting layer 240 can include a hole injecting layer, a hole transporting layer, an emitting layer, an electron transporting layer, and an electron injecting layer. A structure of the organic emitting layer 240 can be changed to various shapes generally known to those in the art.

The organic emitting layer 240 can extend to the upper surface of the bank 220. Also, the organic emitting layer 240 can extend to the upper surface of the second auxiliary electrode 210. In this instance, the organic emitting layer 240 does not cover the entire upper surface of the second auxiliary electrode 210. In detail, the organic emitting layer 240 is not deposited on the upper surface of the second auxiliary electrode 210 covered by the second partition 232. As described above, the organic emitting layer 240 can be manufactured by the deposition process without the mask for covering the upper surface of the second auxiliary electrode 210. In this instance, the organic emitting layer 240 can be provided on the upper surface of the partition 230.

The cathode electrode 250 is provided on the organic emitting layer 240. Since the cathode electrode 250 is provided on a surface from which light is emitted, the cathode electrode 250 is formed of a transparent conductive material. Thus, a resistance of the cathode electrode 250 is increased since the cathode electrode 250 is formed of the transparent conductive material. In order to lower the resistance of the cathode electrode 250, the cathode electrode 250 is connected to the second auxiliary electrode 210. That is, the cathode electrode 250 is connected to the second auxiliary electrode 210 via the gap space between the partition 230 and the bank 220. The cathode electrode 250 can be manufactured by sputtering, that is, a deposition process using a deposition material with inferior straightness. Accordingly, the cathode electrode 250 can be deposited in the gap space between the partition 230 and the bank 220 for the deposition process of the cathode electrode 250.

Also, an encapsulation layer for preventing a permeation of moisture can be additionally provided on the cathode electrode 250. The encapsulation layer can be formed of various materials generally known to those in the art. In addition, a color filter for each pixel can be additionally provided on the cathode electrode 250. In this instance, white light can be emitted from the organic emitting layer 240.

Figure 5:
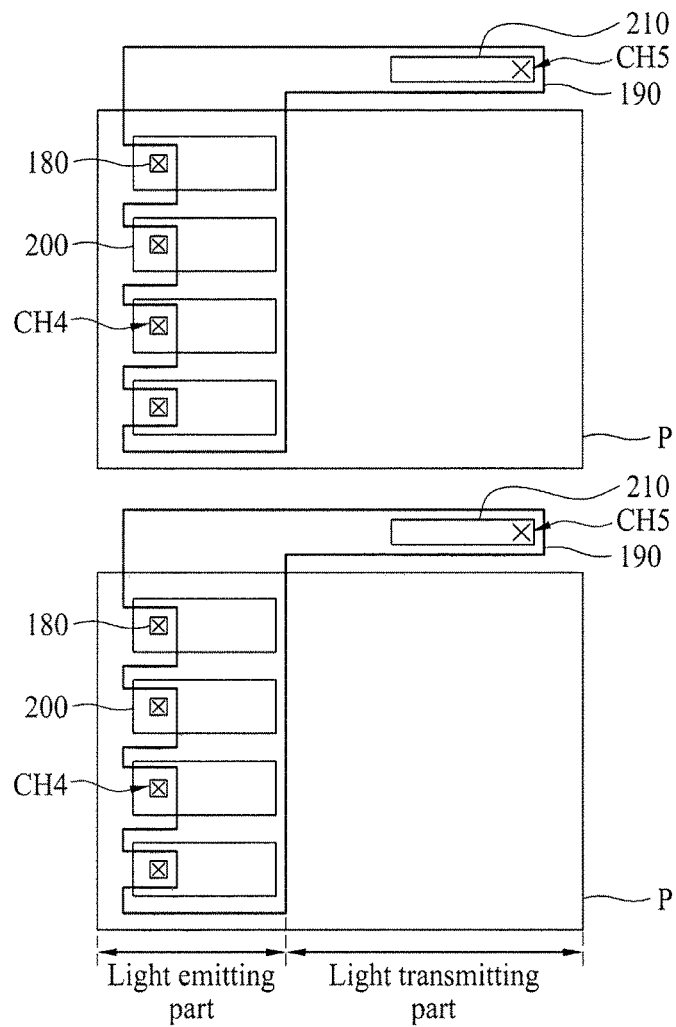
FIG. 5 is a plane view illustrating an organic light emitting display device according to an embodiment of the present invention.

FIG. 5 is a plane view illustrating an organic light emitting display device according to one embodiment of the present invention. For convenience of explanation, FIG. 5 shows only two pixels (P). The same reference numbers will be used throughout the drawings to refer to the same or like parts, and a detailed description for the same parts will be omitted.

As shown in FIG. 5, according to one embodiment of the present invention, there are the plurality of pixels (P) on the substrate, in which each pixel (P) includes a light emitting part and a light transmitting part. The light emitting part is an area for emission of light, and the light transmitting part is an area for transmitting external light without emission of light. The organic light emitting display device including the light emitting part and the light transmitting part can be used as a transparent organic light emitting display device.

The light emitting part corresponds to the area for emission of light. In the light emitting part, the first anode electrode 180 and the second anode electrode 200 are connected to each other via the fourth contact hole (CH4). Also, the first anode electrode 180 is connected to the thin film transistor layer (T) disposed therebelow. Also, the organic emitting layer 240 (See 240 of FIG. 3) and the cathode electrode (See 250 of FIG. 3) are sequentially provided on the second anode electrode 200.

The light transmitting part is not the area for light emission. Thus, a circuit device such as a thin film transistor is not provided in the light transmitting part. However, a light-transmittable material can be provided in the light transmitting part. For example, the passivation layer (See 165 of FIG. 3), the first planarization layer (See 171 of FIG. 3), the second planarization layer (See 172 of FIG. 3), the organic emitting layer (See 240 of FIG. 3), and the cathode electrode (See 250 of FIG. 3) can be provided in the light transmitting part.

In the first auxiliary electrode 190, light can be not transmitted therethrough. Thus, the first auxiliary electrode 190 is not disposed in the light transmitting part, but disposed in the light emitting part. The first auxiliary electrode 190 is formed in the same layer as the first anode electrode 180. Thus, in order to dispose the first auxiliary electrode 190 at a predetermined interval from the first anode electrode 180, and simultaneously to lower the resistance of the cathode electrode (See 250 of FIG. 3), it is necessary to provide the first auxiliary electrode 190 with the maximum possible size in the light emitting part. Also, the first auxiliary electrode 190 extends to the boundary area between the neighboring pixels (P), whereby the first auxiliary electrode 190 can be connected to the second auxiliary electrode 210 in the boundary area between the neighboring pixels (P).

In the second auxiliary electrode 210, light can be not transmitted therethrough. Thus, the second auxiliary electrode 210 is not disposed in the light transmitting part. The second auxiliary electrode 210 is formed in the same layer as the second anode electrode 200. Thus, it is difficult to space the second auxiliary electrode 210 away from the second anode electrode 200 in the light emitting part. Thus, the second auxiliary electrode 210 is provided in the boundary area of the neighboring pixels (P) to which the first auxiliary electrode 190 extends. The second auxiliary electrode 210 is connected to the first auxiliary electrode 190 via the fifth contact hole (CH5) in the boundary area between the neighboring pixels (P). Eventually, the first and second partitions 231 and 232 provided on the second auxiliary electrode 210 are positioned in the boundary area between the neighboring pixels (P).

Figure 6:
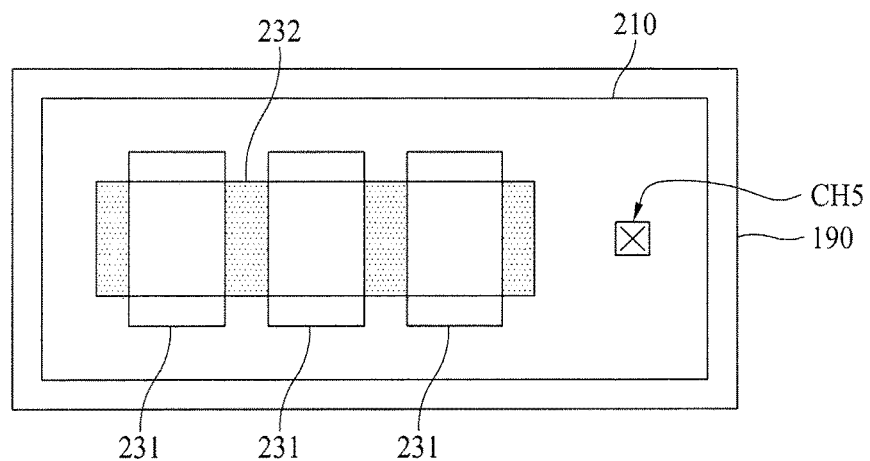
FIG. 6 illustrates first and second partitions in the boundary area between neighboring pixels in the organic light emitting display device according to an embodiment of the present invention.

FIG. 6 illustrates the first partition 231 and the second partition 232 provided in the boundary area between the neighboring pixels (P) according to one embodiment of the present invention.

As shown in FIG. 6, the second auxiliary electrode 210 is provided on the first auxiliary electrode 190, and the second auxiliary electrode 210 is connected to the first auxiliary electrode 190 via the fifth contact hole (CH5).

The plurality of first partitions 231 are provided on the second auxiliary electrode 210, and the plurality of first partitions 231 are spaced apart from each other. Also, the second partition 232 is provided on the plurality of first partitions 231. The second partition 232 is supported by the plurality of first partitions 231, and the second partition 231 is configured to cross the area between each of the plurality of first partitions 231. For example, the second partition 231 is placed on the plurality of first partitions 231 and forms a bridge type structure over the plurality of first partitions 231 and the areas between each of the first partitions 231.

Accordingly, as shown in FIG. 4A, the cathode electrode 250 is deposited in the dotted-line area in which the second partition 232 is not overlapped with the first partition 231, but overlapped with the second auxiliary electrode 210. Thus, the cathode electrode 250 and the second auxiliary electrode 210 are in contact with each other in the dotted-line area.

According to one embodiment of the present invention, the cathode electrode and the second auxiliary electrode are in contact with each other in the boundary area between each of the plurality of first partitions. Thus, even if there is a mis-alignment between the first partition and the second partition, the contact area between the cathode electrode and the second auxiliary electrode is not decreased in size.

According to one embodiment of the present invention, there are the two auxiliary electrodes including the first auxiliary electrode and the second auxiliary electrode, which lower the resistance of the cathode electrode make it possible to easily control the resistance properties of the auxiliary electrode. Especially, the first auxiliary electrode is connected to the second auxiliary electrode and provided below the second auxiliary electrode so that it is possible to lower the resistance of the cathode electrode without decreasing the pixel region.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting display (OLED) device comprising:
    a substrate;
    an anode electrode provided on the substrate;
    an organic emitting layer provided on the anode electrode;
    a cathode electrode provided on the organic emitting layer;
    an auxiliary electrode connected to the cathode electrode;
    a bank provided on either side of the auxiliary electrode; and
    a partition spaced apart from the bank and provided on the auxiliary electrode,
    wherein the partition includes a plurality of first partitions provided on the auxiliary electrode and spaced apart from each other,
    wherein the partition further includes a second partition provided on the plurality of first partitions,
    wherein a width of an upper surface of the second partition is larger than a width of a lower surface of the second partition, and
    wherein the plurality of first partitions are disposed between the second partition and the auxiliary electrode, and each of the plurality of first partitions has a second width in a first direction that is longer than a first width of the second partition in the first direction.

2. The OLED device according to claim 1, wherein the second partition overlaps areas between each of the plurality of first partitions, and the cathode electrode contacts the auxiliary electrode in the areas between each of the plurality of first partitions.

3. The OLED device according to claim 1, wherein a plurality of pixels are provided on the substrate, and
    wherein each pixel includes a light emitting part and a light transmitting part, and the partition is provided in a boundary area between each of the plurality of pixels.

4. The OLED device according to claim 1, wherein the anode electrode includes a first anode electrode, and a second anode electrode connected with the first anode electrode via a contact hole,
    wherein the auxiliary electrode includes a first auxiliary electrode, and a second auxiliary electrode connected with the first auxiliary electrode via a contact hole, and
    wherein the bank and the partition are provided on the second auxiliary electrode.

5. The OLED device according to claim 4, wherein a plurality of pixels are provided on the substrate,
    wherein each pixel includes a light emitting part and a light transmitting part, and
    wherein the first auxiliary electrode extends to a boundary area between each of the plurality of pixels in the light emitting part, and the second auxiliary electrode is provided in the boundary area between each of the plurality of pixels.

6. The OLED device according to claim 4, wherein a width of the first auxiliary electrode is larger than a width of the first anode electrode, and the first auxiliary electrode overlaps with the second anode electrode.

7. The OLED device according to claim 1, wherein a length of the second partition is larger than a total length of the plurality of first partitions combined with lengths of intervals between each of the plurality of first partitions.

8. The OLED device according to claim 1, wherein the first partition and the bank are formed of the same material.

9. The OLED device according to claim 1, wherein the second partition has a reverse tapered shape that narrows towards a bottom surface of the second partition, and
    wherein the bottom surface of the second partition contacts at least two of the plurality of first partitions.

10. The OLED device according to claim 1, wherein the plurality of first partitions are disposed in parallel along a line under the second partition.

11. The OLED device according to claim 1, wherein the auxiliary electrode is connected to the cathode electrode in a gap space between the partition and the bank.

12. The OLED device according to claim 1, wherein the auxiliary electrode is connected to the cathode electrode in a space between at least two of the plurality of first partitions.

13. The OLED device according to claim 1, wherein the auxiliary electrode comprises a first auxiliary electrode and a second auxiliary electrode, and the second auxiliary electrode overlaps with and connects to the first auxiliary electrode.

14. The OLED device according to claim 13, wherein the first auxiliary electrode or the second auxiliary electrode comprises a layered structure including a central auxiliary electrode disposed between an upper auxiliary electrode and a lower auxiliary electrode, and
    wherein the upper and lower auxiliary electrodes include a material having a higher corrosion resistance than the central auxiliary electrode, and the central auxiliary electrode includes a material having a lower electrical resistance than the upper and lower auxiliary electrodes.

15. The OLED device according to claim 14, wherein the upper auxiliary electrode of the first auxiliary electrode covers lateral surfaces of the central and lower auxiliary electrodes of the first auxiliary electrode.

16. The OLED device according to claim 1, wherein the auxiliary electrode comprises a first auxiliary electrode and a second auxiliary electrode, the second auxiliary electrode overlaps with and connects to the first auxiliary electrode,
    wherein the anode electrode comprises a first anode electrode and a second anode electrode, the second anode electrode overlaps with and connects to the first auxiliary electrode, and
    wherein the first or second anode electrode is formed on a same layer as the first or second auxiliary electrode.

17. An organic light emitting display (OLED) device comprising:
    an organic emitting layer disposed on a first pixel electrode;

a second pixel electrode disposed on the organic emitting layer;

an auxiliary electrode disposed between a first bank portion and a second bank portion;

a partition disposed on the auxiliary electrode and between the first and second bank portions, wherein the partition comprises a second partition disposed on a plurality of first partitions; and a gap space between the partition and the first or second bank portion, wherein the auxiliary electrode connects to the second pixel electrode in the gap space between the partition and the first or second bank portion, and wherein the plurality of first partitions are disposed between the second partition and the auxiliary electrode, and each of the plurality of first partitions has a second width in a first direction that is longer than a first width of the second partition in the first direction.

18. The OLED device according to claim 1, wherein the auxiliary electrode is connected to the second pixel electrode in a space between the at least two of the plurality of first partitions.

19. The OLED device according to claim 1, wherein the second partition has a reverse tapered shape that narrows towards a bottom surface of the second partition, and wherein the bottom surface of the second partition contacts at least two of the plurality of first partitions.

\* \* \* \* \*